US011585970B2

(12) United States Patent
Bovard et al.

(10) Patent No.: US 11,585,970 B2
(45) Date of Patent: Feb. 21, 2023

(54) LOW LOSS SINGLE CRYSTAL MULTILAYER OPTICAL COMPONENT AND METHOD OF MAKING SAME

(71) Applicant: Teledyne Scientific & Imaging, LLC, Thousand Oaks, CA (US)

(72) Inventors: Bertrand Bovard, Camarillo, CA (US); Erdem Arkun, Camarillo, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 635 days.

(21) Appl. No.: 16/593,970

(22) Filed: Oct. 4, 2019

(65) Prior Publication Data

US 2021/0103081 A1   Apr. 8, 2021

(51) Int. Cl.
| | | |
|---|---|---|
| *G02B 5/28* | (2006.01) |
| *G02B 5/08* | (2006.01) |
| *G02B 1/11* | (2015.01) |
| *C30B 29/68* | (2006.01) |
| *C30B 29/48* | (2006.01) |
| *C30B 29/12* | (2006.01) |
| *C30B 23/02* | (2006.01) |
| *G02B 5/20* | (2006.01) |
| *G02B 19/00* | (2006.01) |

(52) U.S. Cl.
CPC ............ *G02B 5/281* (2013.01); *C30B 23/025* (2013.01); *C30B 29/12* (2013.01); *C30B 29/48* (2013.01); *C30B 29/68* (2013.01); *G02B 1/11* (2013.01); *G02B 5/0816* (2013.01); *G02B 5/208* (2013.01); *G02B 19/009* (2013.01)

(58) Field of Classification Search
CPC ........ G02B 5/281; G02B 1/11; G02B 5/0816; G02B 5/208; G02B 19/009; G02B 1/00; G02B 1/10; G02B 1/113; G02B 1/115; G02B 5/08; G02B 5/0825; G02B 5/0833; G02B 5/20; G02B 5/207; G02B 5/26; G02B 5/28; G02B 5/282; G02B 5/285; C30B 23/025; C30B 29/12; C30B 29/48; C30B 29/68; C30B 23/02; C30B 25/02; C30B 25/18
USPC ....... 359/359, 350, 577, 580, 582, 583, 584, 359/586, 588, 589, 590
See application file for complete search history.

(56) References Cited

U.S. PATENT DOCUMENTS

| | | | | |
|---|---|---|---|---|
| 2005/0280013 A1* | 12/2005 | Sun | ......................... | H01S 5/183 257/432 |
| 2006/0102916 A1* | 5/2006 | Sun | ...................... | H01L 31/1035 257/E31.022 |

FOREIGN PATENT DOCUMENTS

WO   WO-2005050722 A1 *   6/2005 ............. C30B 23/02

OTHER PUBLICATIONS

J. Fan, 'Material Properties of MBE Grown ZnTe, GaSb and Their Heterostructures for Optoelectronic Device Applications', Doctoral Dissertation, Arizona State University, Dec. 2012.*

* cited by examiner

Primary Examiner — Arnel C Lavarias
(74) Attorney, Agent, or Firm — M.J. Ram & Associates

(57) ABSTRACT

A single crystal multilayer low-loss optical component including first and second layers made from dissimilar materials, with the materials including the first layer lattice-matched to the materials including the second layer. The first and second layers are grown epitaxially in pairs on a growth substrate to which the materials of the first layer are also lattice-matched, such that a single crystal multilayer optical component is formed. The optical component may further include a second substrate to which the layer pairs are wafer bonded after being removed from the growth substrate.

15 Claims, 2 Drawing Sheets

LOW LOSS SINGLE CRYSTAL MULTILAYER OPTICAL COMPONENT AND METHOD OF MAKING SAME

BACKGROUND OF THE INVENTION

Field of the Invention

This invention relates generally to low-loss optical components, and more particularly to low-loss optical components intended for use in the mid- to long-wavelength infrared region of the electromagnetic spectrum.

Description of the Related Art

Low-loss optical components that function in the short wavelength infrared region of the electromagnetic spectrum are readily available. For example, optical mirrors suitable for use in the short wavelength infrared region can be fabricated from $BaCaF_2$/GaAs or AlGaAs/GaAs (single crystal, low loss), or combinations of oxide materials (amorphous, low loss). For example, an approach using $BaCaF_2$/GaAs is described in A. Koeninger, Appl. Phys. B (2014) 1091-1097. However, these approaches fail to work in the mid- and long-wavelength infrared regions due to absorption by these materials, and/or do not have an index range necessary to achieve attractive optical properties.

SUMMARY OF THE INVENTION

A single crystal multilayer optical component and a method of making same are presented, which can provide low loss optical components suitable for use in the mid- and long-wavelength infrared regions of the electromagnetic spectrum.

An optical component in accordance with the present invention comprises first and second layers comprising dissimilar materials, with the materials comprising the first layer lattice-matched to the materials comprising the second layer. The first and second layers are grown epitaxially in pairs on a growth substrate to which the materials of the first layer are also lattice-matched, such that a single crystal multilayer optical component is formed. The thicknesses of the individual layers may be different as required for the desired optical properties. Optical components encompassed by the present invention include optical mirrors, beamsplitters, anti-reflection coatings, and filters.

The dissimilar materials suitably comprise divalent fluorides and/or II-VI materials. For example, the first layer can comprise ZnTe and the second layer can comprise $CaBaF_2$. The first and second layers can be considered a 'layer pair', with an optical component as described herein comprising one or more layer pairs; the stacked layers are referred to herein as a 'multilayer stack'. As noted above, the thicknesses of the individual layers in every layer pair may be different as required for the desired optical properties. In some embodiments, the device's growth substrate may be removed and the multilayer stack wafer bonded to a second substrate, or to the surface of a photodetector.

These and other features, aspects, and advantages of the present invention will become better understood with reference to the following drawings, description, and claims.

DETAILED DESCRIPTION OF THE INVENTION

The present invention provides an optical component having a single crystal multilayer structure made from one or more first and second layer pairs comprising dissimilar materials, with the materials comprising the first layer of the pair lattice-matched to the materials comprising the second layer. The first and second layers are grown epitaxially in pairs on a growth substrate to which the materials of the first layer are also lattice-matched, such that a single crystal multilayer optical component is formed.

For example, $ZnTe/CaBaF_2$ pairs arranged in accordance with the invention can provide a low loss optical mirror for use in the mid- and long-wavelength infrared region of the electromagnetic spectrum. The mirror is suitably achieved by crystal growth of the $ZnTe/CaBaF_2$ pairs on a GaSb substrate or Ga layer. The resulting optical mirror provides a reflective surface in the mid- to long-wavelength infrared region of the spectrum, whereas conventional mirrors based on AlGaAs/GaAs are absorbing at these wavelengths.

Figure 1A:
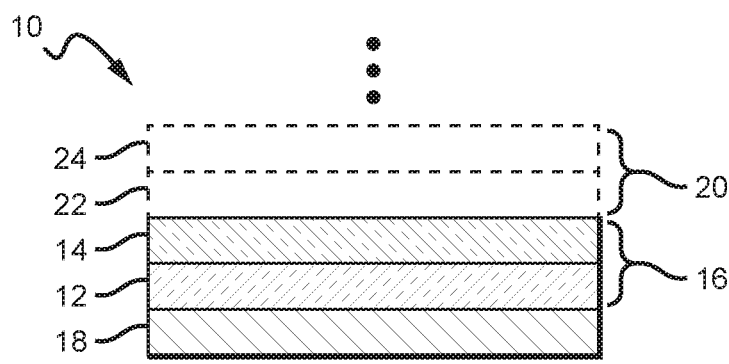
FIG. 1A is a sectional diagram of one possible embodiment of an optical component in accordance with the present invention.

A sectional view of an exemplary embodiment of an optical component per the present invention is shown in FIG. 1A. The component 10 comprises a first layer 12 and a second layer 14 comprising dissimilar materials. The first and second layers form a layer 'pair' 16. The materials comprising first layer 12 are lattice-matched to the materials comprising second layer 14. The first and second layers are grown epitaxially in pairs on a growth substrate 18 to which the materials of the first layer are also lattice-matched, such that a single crystal multilayer optical component is formed.

Additional layer pairs 20 made from the same materials as layer pair 16 can be formed on layer pair 16 as needed. The layer pairs stacked on growth substrate 18, such as layer pairs 16 and 20 in FIG. 1A, are referred to herein as a "multilayer stack". The layers 22 and 24 making up additional layer pairs 20 may have the same thicknesses as layers 12 and 14, or different thicknesses.

An optical component per the present invention can be, for example, an optical mirror, a beamsplitter, an anti-reflection coating, or a filter. Filter types include an edge filter, a bandpass filter, a dichroic filter, or a notch filter. In general, the optical component has an associated optical function, and is arranged such that it performs its function on incoming light which is in a predetermined region of interest in the electromagnetic spectrum. Regions of interest may include the visible, near-infrared, short-wavelength infrared, mid-wavelength infrared, or long-wavelength infrared regions of the spectrum, with the present optical component being particularly well-suited for use in the mid- and long-wavelength infrared regions.

Figure 1B:
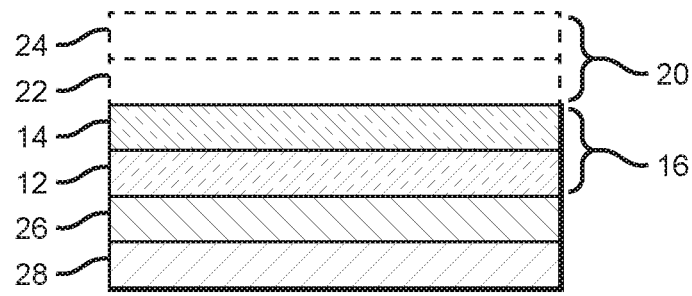
FIG. 1B is a sectional diagram of another possible embodiment of an optical component in accordance with the present invention.

One possible alternate embodiment is shown in FIG. 1B. The multilayer stack is as shown in FIG. 1A, but here the optical component further comprises a layer 26 on a growth substrate 28, with the layer pairs grown on layer 26.

As noted above, first layer 12 and second layer 14 comprises dissimilar materials. These materials preferably comprise divalent fluorides and/or II-VI materials. For example, first layer 12 can comprise ZnTe and second layer 14 can comprise $CaBaF_2$. Growth substrate 18 suitably comprises GaAs, Si, GaSb, or InSb. If the optical component includes layer 26 as shown in FIG. 1B, layer 26 is suitably a GaSb layer on a growth substrate 28, with layer pairs 16, 20 grown on GaSb layer 26. The epitaxial growth method is preferably molecular beam epitaxy (MBE); other techniques such as MOCVD, ion beam deposition or sputtering might also be used, or any other technique known to those skilled in the art. The present invention makes low defect density possible due to single crystal deposition of materials.

As an example, a single crystal multilayer structure comprised of ZnTe and $CaBaF_2$ layer pairs can be grown to achieve a low loss optical mirror for use in the mid- and long-wavelength infrared region of the spectrum. The mirror is achieved by crystal growth of $ZnTe/CaBaF_2$ pairs of a predetermined thickness on a GaSb substrate, or on a GaSb layer on a suitable substrate. The resulting optical mirror improves over state of the art mirrors in that it is able to achieve a reflective surface in the mid- to long-wavelength infrared region of the spectrum, whereas state of the art mirrors based on AlGaAs/GaAs are absorbing at these wavelengths. Applying a single crystal multilayer coating to a surface as described herein also enables low scatter and low absorption losses to be achieved. The thicknesses of the individual layers can be the same or different; the thickness of each layer affects its transmittance and reflectiveness, and can be selected as needed for a particular application and/or to achieve desired optical properties.

For other optical functions, the dissimilar materials might be transparent in the region of interest. For example, an epitaxial wavelength selective filter may be realized using dissimilar materials which are transparent in the mid- and long-wavelength infrared regions of the spectrum, such as a $II-VI/CaBaF_2$ layer pair. Note that while the individual layers of a layer pair may be transparent over the regions of interest, the multilayer stack formed from the layers can be reflective, due to the difference between the respective refractive indices of the first and second materials and the thicknesses of the individual layers in the overall stack.

Prior art mirrors based on AlGaAs/GaAs or $GaAs/BaCaF_2$ (single crystal, low loss), or a combination of oxide materials (amorphous, low loss), either do not work in the mid- and long-wavelength infrared regions due to absorption in these materials, and/or do not have an appropriate index range to achieve attractive optical properties. The current optical component remedies this by using materials with much lower refractive indices than the oxide and As-based materials. The use of II-VI materials and fluorides as described herein provides a large difference in refractive indices and a broad spectral range of transparency, with the difference in the indices affecting the component's functionality (mirror, filter, etc.). In addition, using compounds from the II-VI column of the periodic table has advantages over the state of the art in terms of high transmission (low absorption) of mid- and long-wavelength IR. Depending on the application, the preferred embodiment uses ZnS, ZnSe, or ZnTe as the II-VI material.

Figure 2:
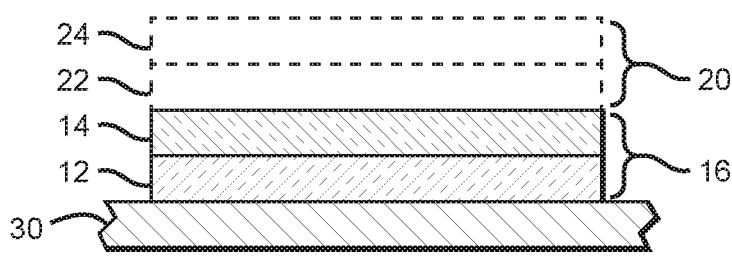
FIG. 2 is a sectional diagram of one possible embodiment of an optical component in accordance with the present invention, which has had its growth substrate removed and is wafer bonded to a second substrate.

In some embodiments, the growth substrate can be removed from the multilayer stack, and the stack then wafer bonded to a different substrate. This is illustrated in FIG. 2, where growth substrate 18 has been removed from multilayer stack 16, 20, and the stack has been wafer bonded to a different substrate 30. Substrate 30 may suitably comprise glass, fused silica, quartz, silicon, ZnS, ZnSe, or germanium, or some combination thereof. As noted above, in general, the optical component has an associated optical function and is arranged such that it performs its said function on incoming light in a predetermined region of interest in the electromagnetic spectrum. Substrate 30 is preferably arranged to be transparent to incoming light in the region of interest. Conventionally, coatings are deposited on surfaces using a vacuum deposition process. However, the present invention makes it possible to apply spectrally selective coatings to surfaces that are not compatible with a vacuum deposition process.

Figure 3:
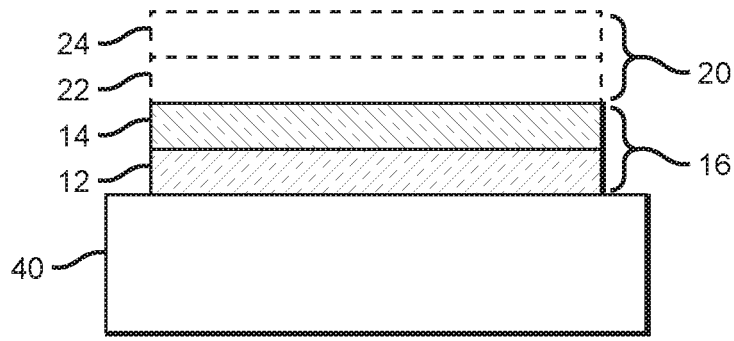
FIG. 3 is a sectional diagram of one possible embodiment of an optical component in accordance with the present invention, which has had its growth substrate removed and is wafer bonded to the surface of a photodetector.

In another embodiment, the growth substrate can be removed from the multilayer stack, and the stack then wafer bonded to a photodetector surface. This is illustrated in FIG. 3. Here, multilayer stack 16, 20 is wafer bonded to the top surface of a photodetector 40. In this way, the optical component provided by multilayer stack 16, 20 can provide an optical function for light that is impinging on the photodetector, such as an optical mirror, a beamsplitter, an anti-reflection coating, or a filter.

Figure 4:
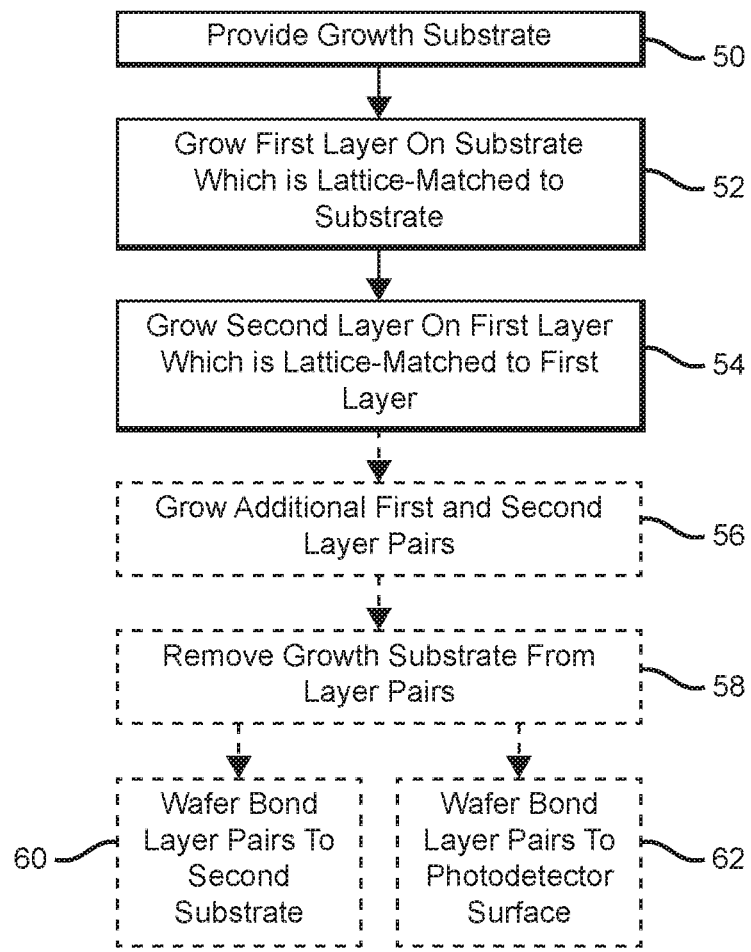
FIG. 4 is a flow diagram illustrating one possible method of forming an optical component in accordance with the present invention.

A method of forming an optical component as described herein is illustrated in FIG. 4. In step 50, a growth substrate is provided. A first layer is epitaxially grown on the growth substrate, preferably using MBE, with the first layer comprising a first material which is lattice-matched to the growth substrate (step 52). A second layer is then epitaxially grown on the first layer, preferably using MBE, with the second layer comprising a second material which is different from the first material, and which is lattice-matched to the first material (step 54), such that a single crystal multilayer optical component is formed. With the first and second layers forming a "first pair", at least one additional pair may be optionally grown on the first pair (step 56).

The growth substrate may optionally be removed from the layer pairs (step 58), and wafer bonded onto a second substrate (step 60). Alternatively, the growth substrate may optionally be removed from the layer pairs and wafer bonded onto a surface of a photodetector (step 62).

As discussed above, in accordance with the present method, the second substrate can comprise, for example, glass, fused silica, quartz, silicon, ZnS, ZnSe, or germanium, or some combination thereof. The first and second materials preferably comprise divalent fluorides and/or II-VI materials; for example, the first layer may comprise ZnTe and the second layer comprise $CaBaF_2$. The first and second layers may be grown on the growth substrate, or another layer may be provided on the growth substrate on which the first and second layers are grown.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An optical component, comprising:
   first and second layers comprising dissimilar materials and having respective thicknesses, the materials comprising said first layer lattice-matched to the materials comprising said second layer;
   said first and second layers grown epitaxially in pairs on a growth substrate to which the materials of said first layer are also lattice-matched, such that a single crystal multilayer optical component is formed; and a second substrate to which said pairs of layers are wafer bonded after being removed from said growth substrate.

2. The optical component of claim 1, wherein said first and second layers have respective thicknesses and wherein the thicknesses of said first and second layers are the same or different.

3. The optical components of claim 2, wherein the thicknesses of said first and second layers are selected to achieve desired optical properties.

4. The optical component of claim 1, wherein said optical component is an optical mirror, a beamsplitter, an anti-reflection coating, or a filter.

5. The optical component of claim 4, wherein said optical component is an edge filter, a bandpass filter, a dichroic filter, or a notch filter.

6. The optical component of claim 1, wherein said optical component has an associated optical function and is arranged such that it performs said function on incoming light in a predetermined region of interest in the electromagnetic spectrum.

7. The optical component of claim 6, wherein said region of interest is the visible, near-infrared, short-wavelength infrared, mid-wavelength infrared, or long-wavelength infrared region of the electromagnetic spectrum.

8. The optical component of claim 1, wherein said second substrate comprises glass, fused silica, quartz, silicon, ZnS, ZnSe, or germanium, or some combination thereof.

9. The optical component of claim 1, wherein said optical component has an associated optical function and is arranged such that it performs said function on incoming light in a predetermined region of interest in the electromagnetic spectrum, said second substrate transparent to incoming light in said region of interest.

10. The optical component of claim 1, wherein said dissimilar materials comprise divalent fluorides or II-VI materials.

11. The optical component of claim 1, wherein said growth substrate comprises GaAs, Si, GaSb, or InSb.

12. The optical component of claim 1, further comprising a GaSb layer on said growth substrate, said first and second layers grown on said GaSb layer.

13. The optical component of claim 12, wherein said optical component comprises at least two of said first and second layer pairs.

14. An optical component, comprising:
first and second layers comprising dissimilar materials and having respective thicknesses, the materials comprising said first layer lattice-matched to the materials comprising said second layer;
said first and second layers grown epitaxially in pairs on a growth substrate to which the materials of said first layer are also lattice-matched, such that a single crystal multilayer optical component is formed; and
a photodetector having a surface to which said optical component is wafer bonded after being removed from said growth substrate.

15. An optical component, comprising:
first and second layers comprising dissimilar materials and having respective thicknesses, the materials comprising said first layer lattice-matched to the materials comprising said second layer;
said first and second layers grown epitaxially in pairs on a growth substrate to which the materials of said first layer are also lattice-matched, such that a single crystal multilayer optical component is formed;
wherein said first layer comprises ZnTe and said second layer comprises $CaBaF_2$.

* * * * *